United States Patent
Frohberg et al.

(10) Patent No.: US 8,828,887 B2
(45) Date of Patent: Sep. 9, 2014

(54) RESTRICTED STRESS REGIONS FORMED IN THE CONTACT LEVEL OF A SEMICONDUCTOR DEVICE

(71) Applicant: GLOBALFOUNDRIES Inc., Grand Cayman (KY)

(72) Inventors: Kai Frohberg, Niederau (DE); Frank Feustel, Dresden (DE); Thomas Werner, Reichenberg (DE)

(73) Assignee: GLOBALFOUNDRIE Inc., Grand Cayman (KY)

( * ) Notice: Subject to any disclaimer, the term of this patent is extended or adjusted under 35 U.S.C. 154(b) by 44 days.

(21) Appl. No.: 13/687,877

(22) Filed: Nov. 28, 2012

(65) Prior Publication Data

US 2013/0084703 A1    Apr. 4, 2013

Related U.S. Application Data

(62) Division of application No. 12/624,891, filed on Nov. 24, 2009, now abandoned.

(30) Foreign Application Priority Data

Nov. 28, 2008  (DE) .......................... 10 2008 059 498

(51) Int. Cl.
*H01L 21/31* (2006.01)
*H01L 21/8234* (2006.01)
*H01L 21/8238* (2006.01)
*H01L 29/78* (2006.01)
*H01L 21/02* (2006.01)
*H01L 21/84* (2006.01)
*H01L 27/12* (2006.01)

(52) U.S. Cl.
CPC .. *H01L 21/02107* (2013.01); *H01L 21/823475* (2013.01); *H01L 21/823425* (2013.01); *H01L 21/823871* (2013.01); *H01L 21/84* (2013.01); *H01L 29/7843* (2013.01); *H01L 27/1203* (2013.01); *H01L 21/823807* (2013.01); *H01L 21/823412* (2013.01); *H01L 21/823431* (2013.01); *H01L 21/823821* (2013.01); *H01L 27/1211* (2013.01); *H01L 21/845* (2013.01); *H01L 29/785* (2013.01)
USPC ......................................................... 438/783

(58) Field of Classification Search
CPC ................... H01L 21/31055; H01L 21/31056; H01L 21/3213
USPC .................................................. 438/783, 694
See application file for complete search history.

(56) References Cited

U.S. PATENT DOCUMENTS

| | | | |
|---|---|---|---|
| 6,982,465 B2 | 1/2006 | Kumagai et al. | 257/369 |
| 6,987,059 B1 | 1/2006 | Burke et al. | 438/627 |

(Continued)

OTHER PUBLICATIONS

Translation of Official Communication from German Patent Office for German Patent Application No. 10 2008 059 498.9 dated Oct. 6, 2009.

(Continued)

*Primary Examiner* — Yu-Hsi D Sun
(74) *Attorney, Agent, or Firm* — Amerson Law Firm, PLLC

(57) ABSTRACT

In sophisticated semiconductor devices, an efficient stress decoupling may be accomplished between neighboring transistor elements of a densely packed device region by providing a gap or a stress decoupling region between the corresponding transistors. For example, a gap may be formed in the stress-inducing material so as to reduce the mutual interaction of the stress-inducing material on the closely spaced transistor elements. In some illustrative aspects, the stress-inducing material may be provided as an island for each individual transistor element.

17 Claims, 6 Drawing Sheets

(56) References Cited

U.S. PATENT DOCUMENTS

| | | | |
|---|---|---|---|
| 2005/0263825 A1* | 12/2005 | Frohberg et al. | 257/369 |
| 2006/0006420 A1* | 1/2006 | Goto | 257/204 |
| 2008/0169484 A1 | 7/2008 | Chuang et al. | 257/190 |
| 2008/0246061 A1 | 10/2008 | Yang et al. | 257/288 |

OTHER PUBLICATIONS

Translation of Official Communication from German Patent Office for German Patent Application No. 10 2008 059 498.9 dated May 18, 2012.

* cited by examiner

RESTRICTED STRESS REGIONS FORMED IN THE CONTACT LEVEL OF A SEMICONDUCTOR DEVICE

CROSS-REFERENCE TO RELATED APPLICATION

This is a divisional of co-pending application Ser. No. 12/624,891, filed Nov. 24, 2009.

BACKGROUND OF THE INVENTION

1. Field of the Invention

Generally, the present disclosure relates to the field of integrated circuits, and, more particularly, to field effect transistors and manufacturing techniques on the basis of stressed dielectric layers formed above the transistors and used for generating a different type of strain in channel regions of different transistor types.

2. Description of the Related Art

Integrated circuits are typically comprised of a large number of circuit elements located on a given chip area according to a specified circuit layout, wherein, in complex circuits, the field effect transistor represents one predominant circuit element. Generally, a plurality of process technologies for advanced semiconductor devices are currently practiced, wherein, for complex circuitry based on field effect transistors, such as microprocessors, storage chips and the like, CMOS technology is currently one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of MOS transistors. Thus, the reduction of the channel length, and associated therewith the reduction of the channel resistivity, may be a dominant design criterion for accomplishing an increase in the operating speed of the integrated circuits.

The shrinkage of the transistor dimensions, however, involves a plurality of issues associated therewith that have to be addressed so as to not unduly offset the advantages obtained by steadily decreasing the channel length of MOS transistors. One issue associated with reduced gate lengths is the occurrence of so-called short channel effects, which may result in reduced controllability of the channel conductivity. Short channel effects may be countered by certain design techniques, some of which, however, may be accompanied by a reduction of the channel conductivity, thereby partially offsetting the advantages obtained by the reduction of critical dimensions.

In view of this situation, it has been proposed to enhance device performance of the transistor elements not only by reducing the transistor dimensions but also by increasing the charge carrier mobility in the channel region for a given channel length, thereby increasing the drive current capability and thus transistor performance. For example, the lattice structure in the channel region may be modified, for instance by creating tensile or compressive strain therein, which results in a modified mobility for electrons and holes, respectively. For example, creating tensile strain in the channel region of a silicon layer having a standard crystallographic configuration may increase the mobility of electrons, which in turn may directly translate into a corresponding increase of the conductivity of N-type transistors. On the other hand, compressive strain in the channel region may increase the mobility of holes, thereby providing the potential for enhancing the performance of P-type transistors.

One efficient approach in this respect is a technique that enables the creation of desired stress conditions within the channel region of different transistor elements by adjusting the stress characteristics of a dielectric layer stack that is formed above the basic transistor structure. The dielectric layer stack typically comprises one or more dielectric layers which may be located close to the transistor and which may also be used in controlling a respective etch process in order to form contact openings to the gate and drain and source terminals. Therefore, an effective control of mechanical stress in the channel regions, i.e., effective stress engineering, may be accomplished by individually adjusting the internal stress of these layers, which may also be referred to as contact etch stop layers, and by positioning a contact etch stop layer having an internal compressive stress above a P-channel transistor while positioning a contact etch stop layer having an internal tensile strain above an N-channel transistor, thereby creating compressive and tensile strain, respectively, in the respective channel regions.

Typically, the contact etch stop layer is formed by plasma enhanced chemical vapor deposition (PECVD) processes above the transistor, i.e., above the gate structure and the drain and source regions, wherein, for instance, silicon nitride may be used due to its high etch selectivity with respect to silicon dioxide, which is a well-established interlayer dielectric material. Furthermore, PECVD silicon nitride may be deposited with a high intrinsic stress, for example, up to 2 Giga Pascal (GPa) or significantly higher of compressive stress and up to 1 GPa and significantly higher of tensile stress, wherein the type and the magnitude of the intrinsic stress may be efficiently adjusted by selecting appropriate deposition parameters. For example, ion bombardment, deposition pressure, substrate temperature, gas flow rates and the like represent respective parameters that may be used for obtaining the desired intrinsic stress.

During the formation of the two types of stressed layers, conventional techniques, also referred to as dual stress liner approaches, may suffer from reduced efficiency when device dimensions are increasingly scaled by using the 45 nm technology and even further advanced approaches, as will be explained in more detail with reference to FIGS. 1a-1b.

FIG. 1a schematically illustrates a top view of a portion of a semiconductor device 100, which may include a plurality of transistor elements 150 that may be provided in a device region having a high packing density. In sophisticated semiconductor devices, certain device areas may require a high density of individual transistor elements, for instance in memory areas and the like, to provide a high degree of information density and the like. In this case, neighboring transistor elements, such as the transistors 150, may have a lateral distance of approximately several hundred nanometers and less, depending on the technology standard under consideration. For example, each of the transistors 150 may comprise an "active" region, which is to be understood as a semiconductor region containing appropriate dopant species so as to form corresponding PN junctions and a channel region required for the transistor function. Furthermore, a gate electrode structure 152 is typically provided and extends along a transistor width direction, indicated as W, wherein the gate electrode structures 152 may typically extend above a corresponding isolation region, which may typically laterally enclose the corresponding active regions 151. The gate electrode structures 152 may be correlated with a corresponding channel length L, which is an important characteristic of the transistors 150 that determines the overall performance thereof. For example, a channel length of 40 nm and less may be used in sophisticated semiconductor devices, thereby also resulting in a corresponding reduced lateral distance between neighboring transistors in densely packed device areas. Furthermore, in the manufacturing stage shown, the transistors 150 may be covered by a stress-inducing dielectric layer 130 (FIG. 1b), which may have an internal stress level for modifying the lattice structure in the channel regions of the transistors 150, thereby increasing charge carrier mobility therein, which in turn may result in enhanced transistor performance, as previously explained.

FIG. 1b schematically illustrates a cross-sectional view of the semiconductor device 100 of FIG. 1a. As illustrated, the semiconductor device 100 may comprise a substrate 101, above which is formed a semiconductor layer 102. For example, the substrate 101, in combination with the semiconductor layer 102, which is typically provided as a silicon semiconductor layer, may define a silicon-on-insulator (SOI) configuration if a buried insulating layer (not shown) is positioned between the substrate 101 and the semiconductor layer 102. Moreover, an isolation structure 103 is formed in the semiconductor layer 102 and separates the active regions 151 of the transistors 150, if required. In other cases, the transistors 150 may be formed in the same active region without providing the isolation structure 103. Typically, the isolation structure 103 is provided as a shallow trench isolation and extends down to a specified depth in the semiconductor layer 102, for instance down to a buried insulating layer if an SOI configuration is considered. Furthermore, the gate electrode structures 152 are formed above the corresponding active regions 151 wherein, in the manufacturing stage shown, each of the gate electrode structures 152 may comprise a gate insulation layer 152C formed on a portion of the active region 151 and separating a gate electrode material 152B from a channel region 154. The gate insulation layer 152C may be comprised of any appropriate material, such as a silicon dioxide based material, while the gate electrode material 152B may be provided in the form of a polysilicon material and the like. Furthermore, a metal-containing material, such as a metal silicide 152A, may be formed in and on the gate electrode material 152B. Additionally, a sidewall spacer structure 152D is formed on sidewalls of the gate electrode material 152B. As previously indicated, lateral extension of the gate electrode material 152B in FIG. 1b may represent the corresponding channel length of the transistors 150 and may be approximately 40 nm and less in sophisticated applications. The corresponding length of the gate electrode material 152B may be correlated with a length of the channel region 154, which is determined by the distance of drain and source regions 153 formed in the corresponding active regions 151. Moreover, a metal silicide region 155 may be provided in an upper portion of the drain and source regions 153 and may be offset from the channel region 154 by a distance that may be substantially determined by a width of the spacer structure 152D. Moreover, the stress-inducing material layer 130 is formed above the transistors 150 and has a high internal stress level so as to induce a desired type of strain in the channel regions 154, such as compressive or tensile strain.

Typically, the semiconductor device 100 as shown in FIGS. 1a-1b may be formed on the basis of the following conventional process strategies. After forming the isolation structure 103, for example using sophisticated lithography, etch, deposition and planarization techniques, the basic conductivity type in the active regions 151 may be defined by an appropriate implantation sequence. For example, the transistors 150 may represent N-channel transistors or P-channel transistors. Thereafter, appropriate materials for the gate insulation layer 152C and the gate electrode material 152B may be provided, which may be accomplished on the basis of sophisticated oxidation and/or deposition and surface treatment techniques for forming material of the gate insulation layer 152C. Next, a gate electrode material is deposited, for instance in the form of a polysilicon material, possibly in combination with any cap materials, anti-reflective coating (ARC) materials and the like, as may be required for the further processing of the device 100. Subsequently, sophisticated lithography techniques are applied to form an appropriate etch mask for patterning the gate electrode material. Thereafter, the dopant profile for the drain and source regions 153 may be defined in combination with appropriate intermediate manufacturing stages of the spacer structure 152D, which, in combination with the gate electrode material 152B, may act as an implantation mask. After final anneal processes for activating the dopant species and re-crystallizing implantation-induced damage, the metal silicide regions 155 and 152A are formed, thereby completing the basic transistor configuration. Next, the stress-inducing material 130 may be deposited, for instance in combination with an appropriate etch stop material (not shown), if further patterning of the material 130 according to well-established dual stress liner approaches is required. The material 130 may be provided as a silicon nitride material which may be deposited with high internal tensile or compressive stress levels, as previously explained.

In sophisticated device geometries, the thickness of the layer 130 has to be adapted to the resulting surface topography, thereby affecting the overall efficiency of the strain-inducing mechanism provided by the stress-inducing layer 130. In addition, in densely packed device regions in which the layer 130 may act on neighboring transistors, such as the transistors 150, the performance enhancing effect of the layer 130 may be significantly less than expected. It is assumed that the reduced strain-inducing efficiency may be caused by the close proximity of the transistors 150 and the corresponding interaction of the internal stress level of the layer 130 on both transistors 150. Consequently, the sophisticated surface topography in densely packed device regions may result in a significantly reduced strain-inducing efficiency, thereby providing a significantly less pronounced performance gain, although stress-inducing materials of high internal stress levels may be used.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to semiconductor devices and manufacturing techniques in which an enhanced strain-inducing mechanism may be accomplished on the basis of stressed dielectric materials formed above closely spaced transistor elements by providing a decoupling region between the adjacent transistors in order to reduce the effect of a portion of the stress-inducing layer provided above one transistor on another portion of the stress-inducing layer that is provided above the neighboring transistor. In some illustrative embodiments, the stress decoupling region may be realized by providing a gap in the stress-inducing material between closely spaced transistor elements, wherein the gap may extend at least along the entire transistor width dimension. In still other illustrative embodiments disclosed herein, the stress-inducing material may be provided in the form of "islands" formed above respective transistor elements, thereby providing an enhanced degree of decoupling between neighboring transistor elements. Due to the significant reduction of the mutual interaction of the stress-inducing material on two adjacent transistor elements, the stress-inducing efficiency of each portion of the stress-inducing material isolated by the stress decoupling region may be enhanced, thereby also providing superior transistor performance compared to conventional strategies. In some illustrative aspects disclosed herein, the concept of providing a decoupling region between adjacent transistor elements may be applied to dual stress liner approaches in which different types of stressed dielectric materials may be positioned above different types of transistors, which, in some illustrative embodiments, may be accomplished without requiring additional process steps for forming the stress decoupling region. Hence, superior strain-inducing efficiency may be accomplished, substantially without adding to additional process complexity.

One illustrative method disclosed herein comprises forming a stress-inducing layer above a first transistor and a second transistor which are formed in a device level of a semiconductor device. The method further comprises forming a stress decoupling region in the stress-inducing layer between the first and second transistors, wherein the stress decoupling region extends along a transistor width direction of the first and second transistors.

A further illustrative method disclosed herein relates to inducing strain in transistors of a semiconductor device. The method comprises forming a first stress-inducing layer above a first transistor and a second transistor. Furthermore, the method comprises selectively removing the first stress-inducing layer from a region between the first and second transistors, wherein the region extends at least along a width dimension of the first and second transistors.

One illustrative semiconductor device disclosed herein comprises a first transistor comprising a first channel region and a second transistor comprising a second channel region. Moreover, the semiconductor device comprises a stress-inducing layer formed above the first and second transistors, which induces a specified type of strain in the first and second channel regions. Additionally, the semiconductor device comprises a stress decoupling region formed laterally between the first and second transistors and extending at least along a width of the first and second transistors, wherein the stress decoupling region represents a gap in the stress-inducing layer.

BRIEF DESCRIPTION OF THE DRAWINGS

The disclosure may be understood by reference to the following description taken in conjunction with the accompanying drawings, in which like reference numerals identify like elements, and in which.

Figure 1A:
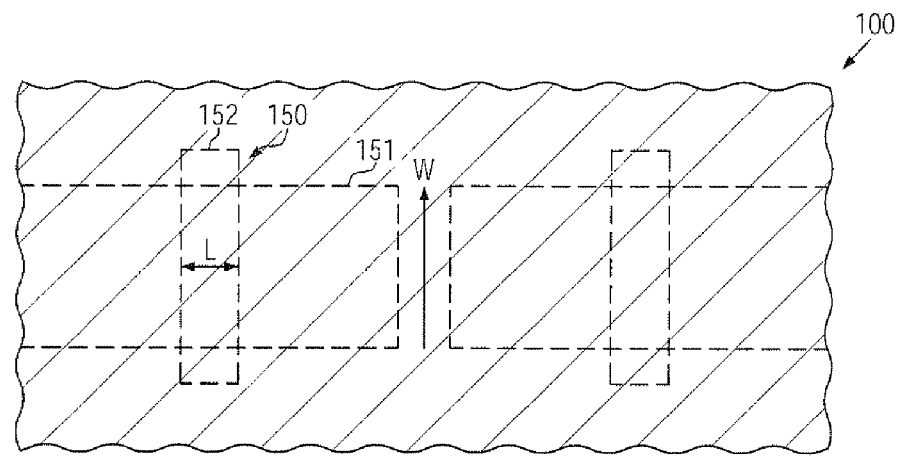
FIGS. 1a-1b schematically illustrate a top view and a cross-sectional view, respectively, wherein neighboring transistors in a densely packed device region are covered by a common stress-inducing material in order to enhance performance of the transistors, according to conventional strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides semiconductor devices and techniques in which a decoupling of the effect of a stress-inducing dielectric material may be accomplished between closely spaced transistor elements, such as transistors of the same conductivity type or of opposite conductivity type, thereby creating an even further enhanced strain component in the channel regions of the individual transistors. For example, in densely packed regions of sophisticated semiconductor devices, a plurality of transistor elements, for instance of the same conductivity type, may be covered by a stress-inducing material, the efficiency of which may be significantly enhanced by providing stress-inducing material with reduced thickness or by completely avoiding the presence of the stress-inducing material in a region located between the closely spaced transistors. Without intending to restrict the present application to the following explanation, it is believed that a continuous stress-inducing material positioned between the transistor areas of closely spaced transistors may result in a reduced strain-inducing efficiency in both transistors since, at the transition area between both transistors, oppositely oriented stress components may have to be provided by the stress-inducing material, which, therefore, results in an overall reduction of the internal stress component at and in the vicinity of the transition area. For this reason, in some illustrative embodiments disclosed herein, at least the stress-inducing material provided in a densely packed device region may be applied in an "island"-like manner in order to achieve a highly efficient decoupling effect between the closely spaced transistor elements. In still other illustrative embodiments, a corresponding stress decoupling region may be formed at least along the transistor width dimension in order to increase the strain component along the current flow direction between adjacent transistor elements. The stress decoupling region may thus be considered as a gap extending along at least the transistor width dimensions of closely spaced transistor elements, wherein the gap may be filled with an interlayer dielectric material in a later manufacturing stage, which, however, may nevertheless result in a significant decoupling effect. For example, if a pronounced copper diffusion hindering effect may be required in the stress decoupling region, an appropriate material, such as silicon nitride, nitrogen-containing silicon carbide, silicon carbide and the like, may be deposited, for instance, after providing the stress-inducing material and forming the corresponding gap therein, while, in other cases, a corresponding diffusion hindering material may be provided prior to actually depositing one or more stress-inducing materials. Consequently, in this case, a desired degree of confinement of materials to be formed in the metallization system of the semiconductor device may be accomplished, while nevertheless providing an efficient stress decoupling effect between closely spaced transistor elements.

Figure 1B:
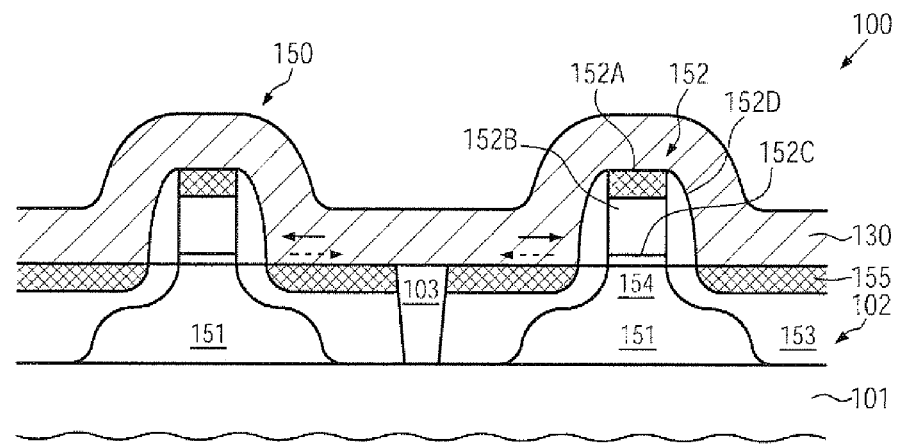

With reference to FIGS. 2a-2j, further illustrative embodiments will now be described in more detail, wherein reference may also be made to FIGS. 1a-1b, if appropriate.

Figure 2A:
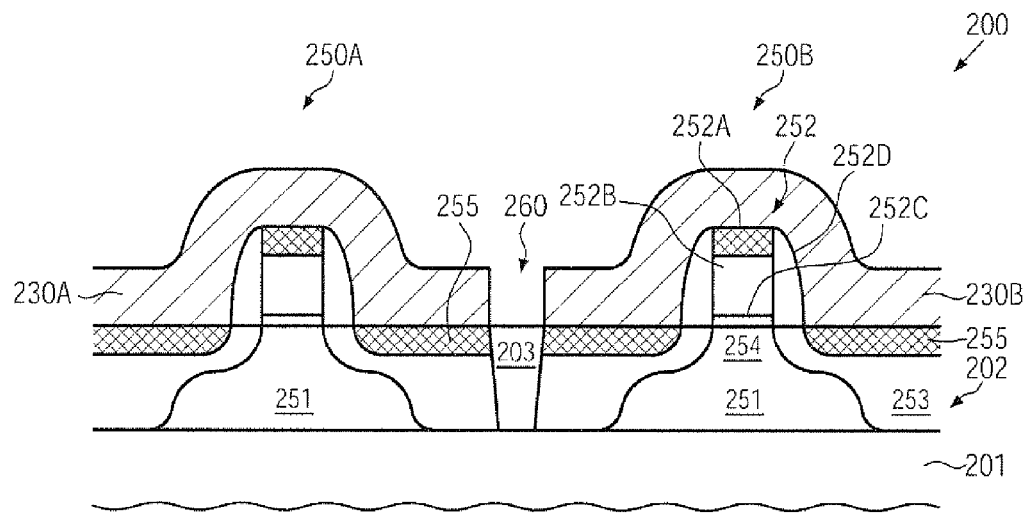
FIGS. 2a-2b schematically illustrate a cross-sectional view and a top view, respectively, of neighboring transistor elements formed in a densely packed device region, wherein a stress decoupling region is provided between the neighboring transistors in order to further enhance the strain-inducing effect of corresponding portions of a stress-inducing material formed above the transistors and separated by the stress decoupling region, according to illustrative embodiments.

FIG. 2a schematically illustrates a cross-sectional view of a semiconductor device 200 comprising a substrate 201, above which may be formed a semiconductor layer 202. The substrate 201, in combination with the semiconductor layer 202, may represent any appropriate combination of a carrier material and a semiconductor material for forming therein and thereabove corresponding transistor elements, such as transistors 250A, 250B. Additionally, for the substrate 201 and the semiconductor layer 202, the same criteria may apply as previously explained with reference to the components 101 and 102 of the semiconductor device 100 shown in FIGS. 1a-1b. Moreover, the transistors 250A, 250B may each comprise a gate electrode structure 252, which in turn may include a gate insulation layer 252C, a gate electrode material 252B, possibly in combination with a metal-containing material 252A, and a spacer structure 252D. Moreover, drain and source regions 253 are formed in corresponding active regions 251, which may be defined on the basis of an isolation structure 203 within the semiconductor layer 202. The components of the transistors 250A, 250B described so far may have a similar configuration as previously described with reference to the transistors 150. It should be appreciated, however, that the transistors 250A, 250B may have any other appropriate configuration in which a strain-inducing effect may provide enhanced transistor performance. For example, the transistors 250A, 250B may also represent non-planar transistor architectures, such as multiple gate transistors, in which, typically, a semiconductor fin and the like may be used as a channel region in order to provide two or more non-planar channel regions in order to increase overall transistor width and improve channel controllability without requiring extremely thin gate electrode materials. Moreover, the transistors 250A, 250B may comprise additional strain-inducing mechanisms, such as embedded semiconductor alloys in the form of silicon/germanium, silicon/carbon, silicon/germanium/tin, silicon/tin and the like, if a further enhancement of a conductivity of the channel regions 254 is required. For convenience, any such strain-inducing mechanisms are not shown in FIG. 2a. Moreover, although the isolation structure 203 is illustrated so as to separate the active regions 251 of the transistors 250A, 250B, in other cases, both transistors may be formed on the basis of a common active region without providing an intermediate isolation structure. In some illustrative embodiments, the transistors 250A, 250B may represent transistors of the same conductivity type, such as P-channel transistors or N-channel transistors, the performance of which is to be enhanced by providing a stress or strain-inducing material. Moreover, the transistors 250A, 250B may, in some illustrative embodiments, represent closely spaced transistors in the sense that the transistors 250A, 250B may be components of a densely packed device region in which the distance between the adjacent gate electrode structures 252 may be on the order of magnitude of the overall length of the active regions 251 and may be approximately 200 nm or less. It should be appreciated, however, that the principles disclosed herein may also be applied to less critical device dimensions and hence the principles disclosed herein may also be applied to semiconductor devices including transistor elements having a gate length of approximately 100 nm and less instead of sophisticated devices having a gate length of approximately 40 nm and less.

Moreover, as illustrated in FIG. 2a, the transistors 250A, 250B may be covered by a stress-inducing material, indicated as 230A, 230B, which, in the embodiment shown, may provide the same type of strain in the corresponding channel regions 254. Furthermore, a gap or stress decoupling region 260 may be provided between the transistors 250A, 250B in order to reduce a mutual interaction of the stress inducing materials 230A, 230B on the transistors 250B, 250A, respectively. The stress decoupling region 260 may be understood as an area in which a stress-inducing material may have a significantly reduced thickness compared to the materials 230A, 230B, while, in the embodiment shown, the corresponding stress-inducing material having the same type of stress compared to the layers 230A, 230B may be substantially completely removed.

Figure 2B:
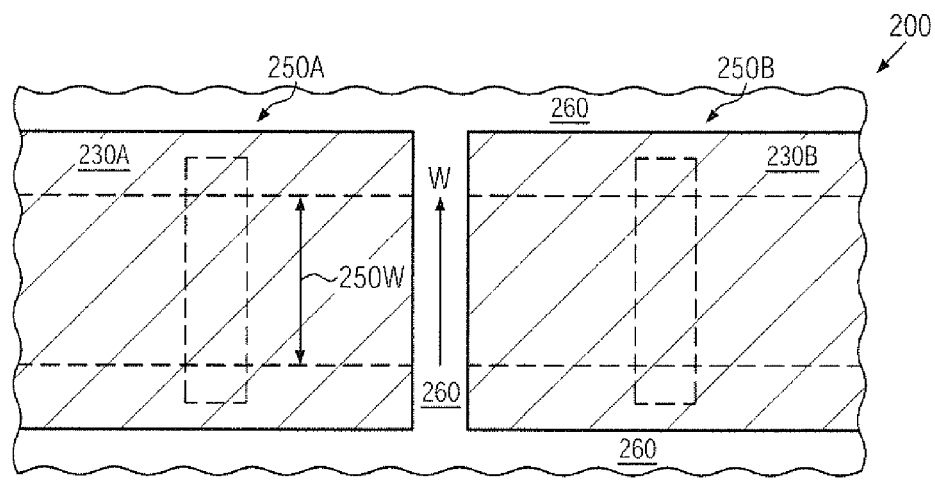

FIG. 2b schematically illustrates a top view of the semiconductor device 200 of FIG. 2a. As illustrated, the stress decoupling region 260 may extend along the transistor width direction, indicated by W, and may have a corresponding dimension in this direction that is equal to or greater than a corresponding transistor width 250W. Consequently, an efficient decoupling effect may be accomplished along the entire transistor width 250W. In some illustrative embodiments, as illustrated in FIG. 2b, the stress decoupling region 260 may also extend along a transistor length direction, thereby providing an island of stress-inducing material for each of the transistors 250A, 250B. Consequently, an efficient decoupling may also be accomplished along the transistor width direction, for instance when neighboring transistors may be provided with a 90 degree angular offset with respect to the orientation of the transistors 250A, 250B.

It should be appreciated that, as previously explained, the stress-inducing materials 230A, 230B may have the same type of internal stress when the transistors 250A, 250B represent transistors of the same conductivity type. For example, the materials 230A, 230B may have a high internal compressive stress level or a high tensile stress level if performance of P-channel transistors and N-channel transistors, respectively, is to be increased for a standard crystallographic orientation of the active regions 251. A standard crystallographic configuration is to be understood as a silicon-based semiconductor material having a (100) surface orientation, while the transistor length direction is oriented along the <110> crystallographic axis. It should be appreciated, however, that other internal stress levels may be applied for P-channel transistors and N-channel transistors, respectively, if a different basic crystallographic configuration of the active regions 251 is used.

The semiconductor device 200 as illustrated in FIGS. 2a-2b may be formed on the basis of the following processes. After completing the basic transistor configuration, which may include manufacturing techniques as also previously described with reference to the transistors 150 of the device 100, a stress-inducing material layer may be deposited by using well-established deposition techniques. For example, the stress-inducing materials 230B, 230B may be formed as a continuous stress-inducing layer, thereby also covering the stress decoupling region 260. In other illustrative embodiments, the semiconductor device 200 may be exposed to a surface treatment in order to reduce or block a significant deposition of material within the stress decoupling region 260 so that the patterning of the regions 230A, 230B may be accomplished during the deposition process. For example, appropriate deposition masks may be formed, for instance in a self-aligned manner, as will be described later on in more detail, which may result in a significantly reduced deposition rate above the region 260, wherein mask material may be removed in a later manufacturing stage, thereby also removing any material of the stress-inducing layer in order to obtain the stress decoupling region 260. In some illustrative embodiments, the stress decoupling region 260 may be defined on the basis of lithography techniques, for instance by appropriately patterning the continuously deposited stress-inducing material and subsequently patterning the same on the basis of an appropriate etch mask. For this purpose, appropriate etch stop materials may be used (not shown), as will also be described later on in more detail. It should further be appreciated that other stress-inducing materials may be deposited and may be patterned so as to provide a corresponding strain-inducing mechanism for other transistor types, as will be described later on in more detail, thereby providing a high degree of compatibility with conventional dual stress liner approaches. It should be appreciated, however, that the process sequence for providing the stress decoupling region 260 may be restricted to certain device regions, such as densely packed device regions, while, in other device areas, substantially continuous stress-inducing materials may be provided above transistors of the same conductivity type, as is, for instance, illustrated in FIGS. 1a-1b.

With reference to FIGS. 2c-2f, further illustrative embodiments will now be described in which stress-inducing material layers of different internal stress level may be applied, wherein at least one of these layers may receive a stress decoupling region between neighboring transistor elements.

Figure 2C:
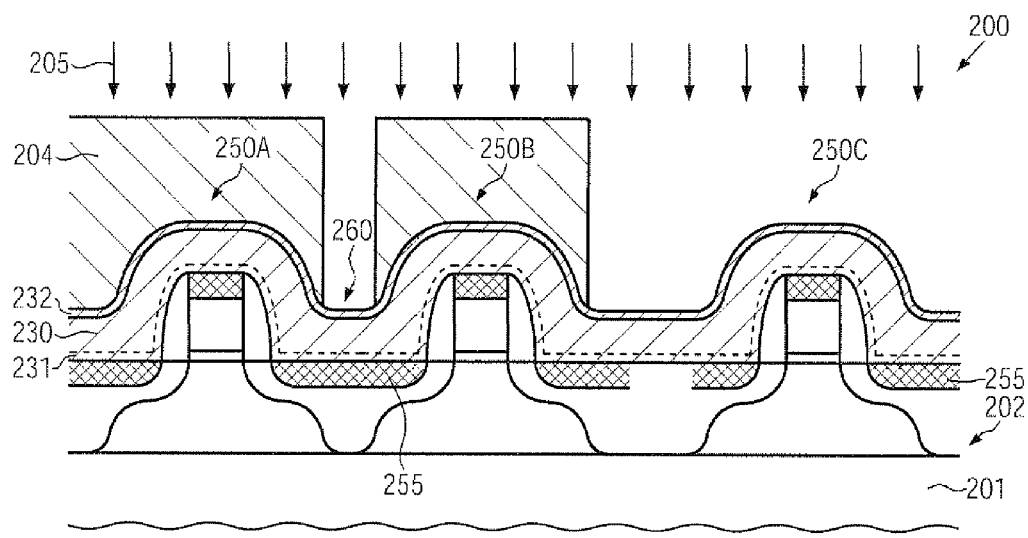
FIGS. 2c-2f schematically illustrate cross-sectional views of a semiconductor device during various manufacturing stages in forming stress-inducing layers of different type above transistors of different type, while also providing a stress decoupling region between neighboring transistors, according to illustrative embodiments.

FIG. 2c schematically illustrates a cross-sectional view of the semiconductor device 200 in which one or more additional transistors 250C may be provided, which may represent a different type of transistor requiring a different type of internal strain in order to enhance performance thereof. Furthermore, in the manufacturing stage shown, a first stress-inducing layer 230 is formed above the transistors 250A, 250B and 250C, possibly in combination with etch stop and etch control materials. For example, an etch stop layer 231, for instance in the form of a silicon dioxide layer and the like, may be formed directly on the transistors 250A, 250B and 250C, followed by the actual stress-inducing material of the layer 230, for instance in the form of silicon nitride, nitrogen-containing silicon carbide, diamond-like carbon and the like. Furthermore, the layer 230 may comprise a further etch stop or control layer 232, for instance in the form of a silicon dioxide material. It should be appreciated, however, that, in other illustrative embodiments, one or both material layers 231, 232 may be omitted, depending on the overall process strategy. Furthermore, an etch mask 204 is provided and may expose the transistor 250C, as well as an area corresponding to the decoupling region 260. Thus, in the embodiment shown, it is assumed that the internal stress level of the layer 230 may be appropriate for enhancing performance of the transistors 250A, 250B. It should be appreciated, however, that, in other illustrative embodiments, the mask 204 may expose the transistors 250A, 250B and may cover the transistor 250C if the layer 230 provides increased performance of the transistor 250C.

The semiconductor device 200 as illustrated in FIG. 2c may be formed on the basis of process techniques which may also be used in a similar manner in well-established dual stress liner approaches. That is, the etch stop layer 231, if required, may be deposited, followed by the deposition of the stress-inducing material 230. Finally, the etch stop layer 232 may be deposited or formed by surface treatment, as will be described later on in more detail. Thereafter, in the embodiment shown, contrary to conventional approaches, the etch mask 204 may be provided so as to define the stress decoupling region 260 in addition to exposing the transistor 250C. It should be appreciated that a corresponding stress decoupling region may also be provided between neighboring transistors having the same conductivity type as the transistor type 250C in a later manufacturing stage.

After forming the etch mask 204 using well-established lithography techniques, an etch process 205 may be performed so as to etch first through the layer 232, if provided, and subsequently removing material of the layer 230 selectively to the etch stop layer 231, if provided, or selectively to the metal silicide region 255 or a corresponding isolation structure, if provided, for instance as is shown in FIGS. 2a-2b.

Figure 2D:
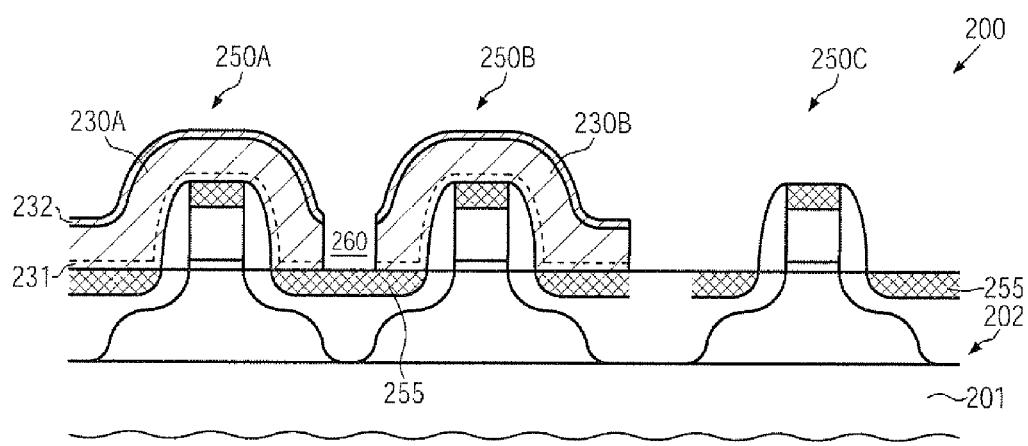

FIG. 2d schematically illustrates the semiconductor device 200 after the etch process 205 and the removal of the etch mask 204. Moreover, any residues of the etch stop material 231 may have been removed from the stress decoupling region 260 and from above the transistor 250C, if desired. Consequently, the stress-inducing materials 230A, 230B are formed above the corresponding transistors 250A, 250B and are separated by the stress decoupling region 260. On the other hand, the one or more transistors 250C are exposed in order to receive a further stress-inducing material for enhancing performance of the one or more transistors 250C.

Figure 2E:
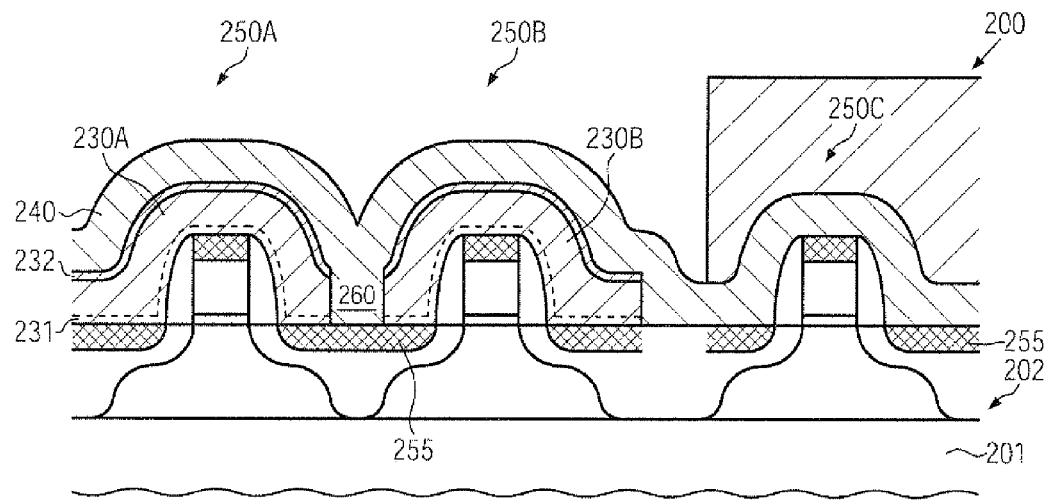

FIG. 2e schematically illustrates the semiconductor device 200 in a further advanced manufacturing stage. As illustrated, a further stress-inducing layer 240 is formed above the transistors 250A, 250B and 250C. Furthermore, an etch mask 206 may be formed above the transistor 250C and may expose the transistors 250A, 250B and the stress decoupling region 260. As previously explained, the etch mask 206 may also comprise corresponding openings for defining stress decoupling regions for transistors 250C, if provided in the form of closely spaced transistor elements for which an efficient decoupling of the stress transfer provided by the layer 240 is desired. Consequently, the etch mask 206 may be formed on the basis of similar lithography techniques as previously explained with reference to the etch mask 204 (FIG. 2c). The stress-inducing material 240 may be deposited on the basis of well-established techniques, thereby adjusting a desired internal stress level thereof. Thereafter, an etch process may be performed, such as a plasma assisted selective etch process, in order to remove exposed portions of the material 240 selectively to the etch stop material 232 and the semiconductor layer 202 or any components contained therein, such as the metal silicide regions 255, or any isolation structures and the like. In other cases, if desired, the etch stop liner 231 may be maintained during the preceding manufacturing sequence and may also be used as an etch stop material during the corresponding etch process. Thus, after removing the material 240 from above the transistors 250A, 250B, the etch process may be reliably stopped or at least be significantly slowed down, while the etch front advances within the stress decoupling region 260, thereby removing the material of the layer 240.

Figure 2F:
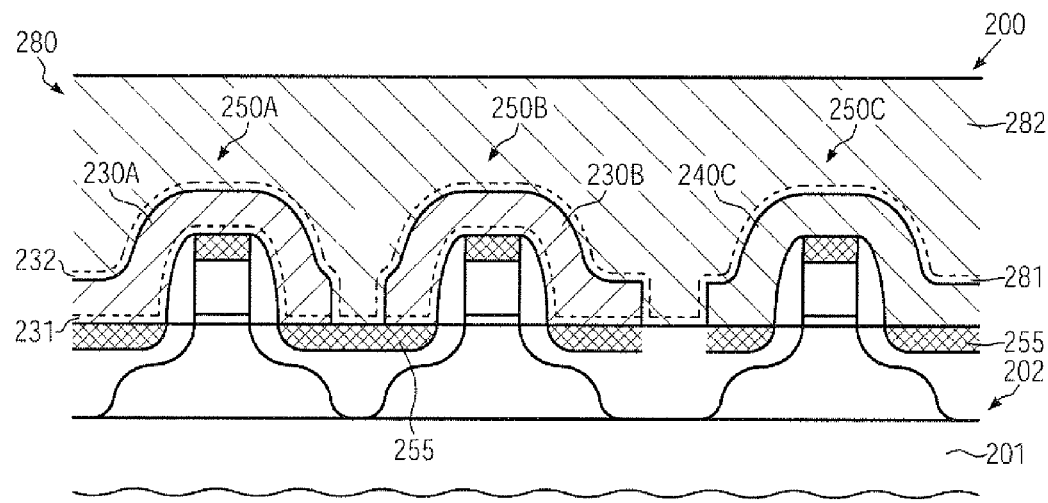

FIG. 2f schematically illustrates the semiconductor device 200 in a further advanced manufacturing stage. As illustrated, the transistors 250A, 250B have formed thereabove stress-inducing materials 230A, 230B, respectively, which may provide the same type of strain in the channel regions 254, as previously explained, while the transistor 250C is covered by a stress-inducing material 240C having an internal stress level so as to enhance performance of the transistor 250C. Furthermore, an interlayer dielectric material 280 may be formed so as to enclose and passivate the transistors 250A, 250B, 250C. For example, the interlayer dielectric material 280 may comprise silicon dioxide, possibly in combination with other materials, if required. For example, in some illustrative embodiments, the material 280 may include a first dielectric layer 281, which may exhibit enhanced diffusion hindering capabilities, for instance with respect to critical metal materials, such as copper and the like, which may typically be used during the further processing of the device 200, when forming a metallization system. Moreover, a second dielectric material 282 may be provided, for instance in the form of silicon dioxide. It should be appreciated, however, that the layer 281 may also be provided as a top layer of the interlayer dielectric material 280 or may even be completely omitted. Thus, the stress decoupling region 260 may act as a barrier between the materials 230A, 230B thereby significantly reducing a mutual stress interaction between the transistors 250A, 250B, which in turn may result in enhanced strain in each of the transistors 250A, 250B. On the other hand, the layer 240C may provide a desired strain component in the transistor 250C, wherein, as previously discussed, a corresponding stress decoupling region 260 may also be provided between any transistors adjacent to the transistor 250C.

With reference to FIGS. 2g-2j, further illustrative embodiments will now be described in which the stress decoupling region may be defined on the basis of a self-aligned process sequence, thereby imposing less restrictive constraints on a corresponding patterning regime.

Figure 2G:
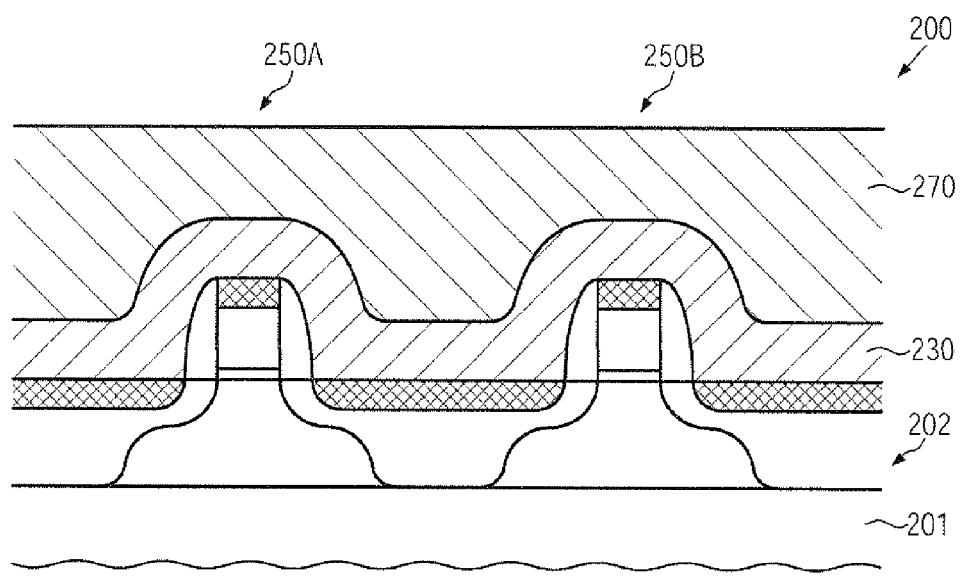
FIGS. 2g-2j schematically illustrate cross-sectional views of a semiconductor device during various manufacturing stages in which a stress decoupling region may be formed on the basis of a self-aligned process flow, according to further illustrative embodiments.

FIG. 2g schematically illustrates the semiconductor device 200 with the stress-inducing layer 230 formed above the transistors 250A, 250B. Moreover, a mask material 270 is provided above the transistors 250A, 250B so as to encapsulate the transistors and provide a substantially planar surface topography. For example, the mask material 270 may be formed by using a polymer material, a resist material and the like, which may be deposited on the basis of spin-on techniques, thereby obtaining the desired planar surface topography. In other cases, an additional planarization process, such as a chemical mechanical polishing (CMP) process, may be performed in order to obtain a desired degree of flatness.

Figure 2H:
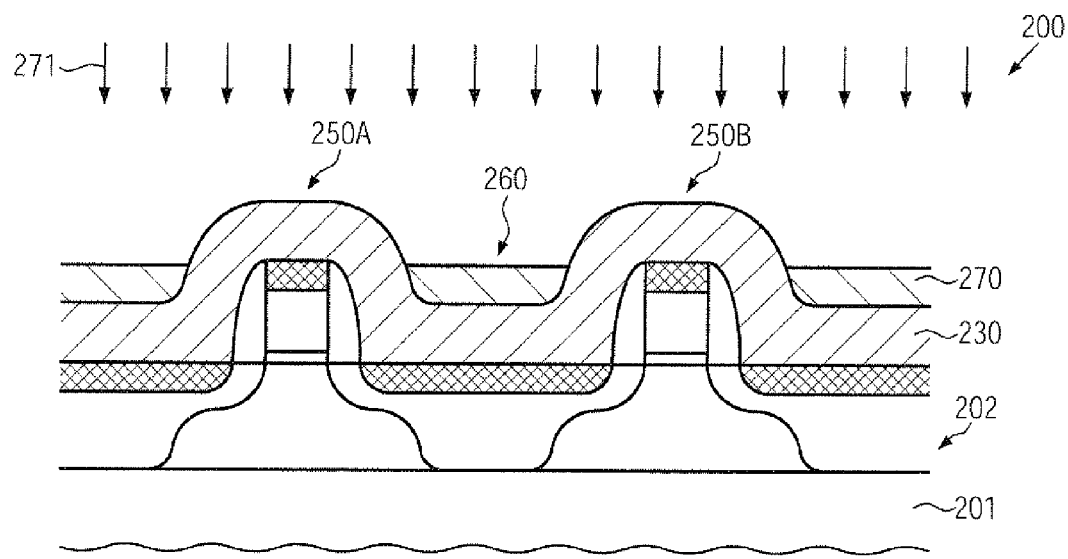

FIG. 2h schematically illustrates the semiconductor device 200 during a removal process 271 in which a portion of the mask material 270 may be removed, thereby exposing a significant portion of the layer 230, while covering an area corresponding to the stress decoupling region 260. The etch process 271 may be performed on the basis of plasma assisted etch recipes, wet chemical etch recipes in order to remove material of the mask layer 270 selectively to the layer 230. For example, appropriate plasma assisted recipes or wet chemical etch recipes are available for a plurality of organic materials, which may be selectively removed with respect to silicon nitride and the like.

Figure 2I:
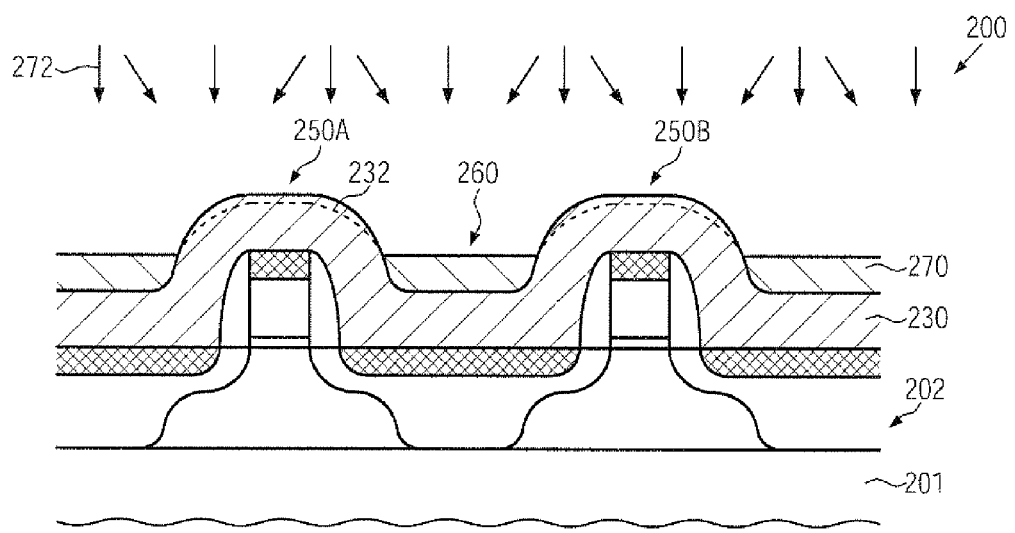

FIG. 2i schematically illustrates the semiconductor device 200 in a further advanced manufacturing stage in which the device 200 may be exposed to a surface treatment 272. For example, the surface treatment 272 may be performed in a plasma ambient including oxygen in order to form an oxygen-containing surface layer 232 on the exposed portions of the layer 230, while the mask material 270, which may still be stable at the temperature during the treatment 272, may substantially avoid a surface modification of portions of the layer 230 covered by the mask material 270. Consequently, the material 232 may be provided in a highly selective manner on the basis of the mask material 270. Thereafter, the mask material 270 may be removed, for instance by established wet chemical or plasma assisted etch recipes, for instance by using well known etch chemistries for removing polymer materials, resist materials and the like.

Figure 2J:
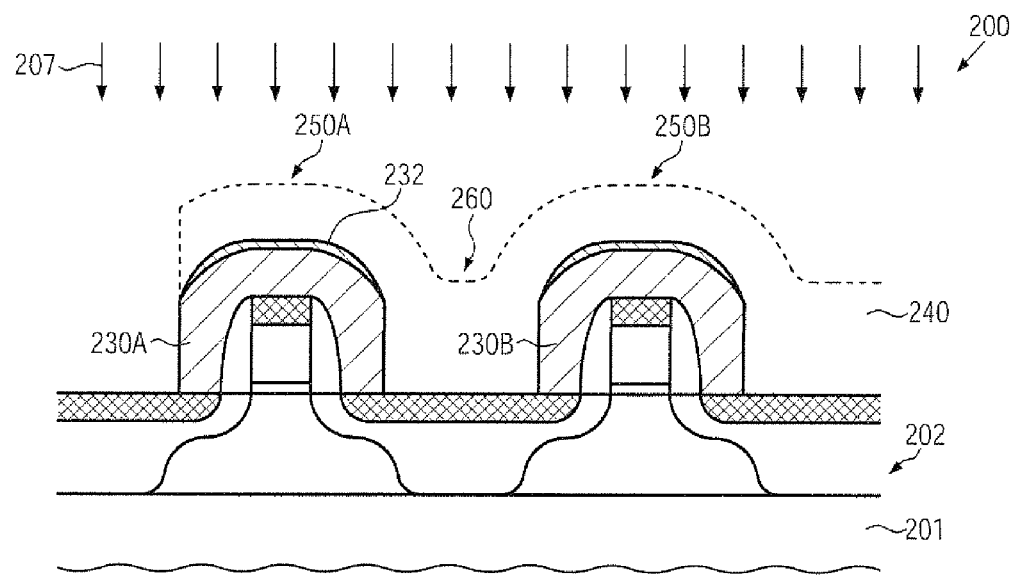

FIG. 2j schematically illustrates the semiconductor device 200 exposed to an anisotropic plasma assisted etch ambient 207. The etch ambient 207 may be performed on the basis of a selective etch chemistry for removing material of the layer 230 selectively to the etch stop material 232. For this purpose, well-established plasma assisted recipes are available and may be used. Consequently, during the etch process 207, a significant portion of the material of the layer 230 may be removed, thereby forming the stress decoupling region 260. In some illustrative embodiments, material of the stress-inducing layer 240 may also be removed when a dual stress liner approach is to be applied to the device 200, as is previously discussed. Consequently, in this case, at an initial phase of the etch process 207, exposed portions of the layer 240 may be removed, wherein the etch front may then be stopped at the etch stop material 232, while the etch process further advances in the region 260.

Consequently, the stress decoupling region 260 may be formed on the basis of a self-aligned mechanism, thereby avoiding highly sophisticated lithography processes and enabling the usage of lithography masks, which may also be used during conventional dual stress liner approaches. It should further be appreciated that a corresponding self-aligned strategy may also be applied for patterning the layers 230A, 230B during the deposition thereof. For example, based on the above-described self-aligned mechanism, a mask material, such as the material 270 (FIG. 2i), may be provided so as to have a surface structure at which a significant deposition of stress-inducing material may be suppressed. Consequently, upon depositing the stress-inducing material and a subsequent etch process, only negligible amounts of stress-inducing material may be removed from above the transistors 250A, 250B while the corresponding mask material may be exposed in the region 260 and may be subsequently removed, thereby providing the stress decoupling region 260.

As a result, the present disclosure provides semiconductor devices and methods for forming the same in which the strain-inducing mechanisms between closely spaced transistors may be efficiently decoupled by providing a gap or a decoupling region in a stress-inducing material formed above the closely spaced transistor elements. In some illustrative embodiments, this may be accomplished by using a dual stress liner approach without requiring any additional lithography process by appropriately modifying the lithography masks so as to define the corresponding decoupling regions. In still other illustrative embodiments, a self-aligned mechanism may be used for defining the stress decoupling region, thereby enabling a less critical patterning regime.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    forming a stress-inducing layer above a first transistor and a second transistor formed in a device level of a semiconductor device; and
    forming a stress decoupling region in said stress-inducing layer between said first and second transistors, said stress decoupling region extending along a transistor width direction of said first and second transistors by forming a mask material on said stress-inducing layer, removing a portion of said mask material so as to expose a first portion of said stress-inducing layer, performing a surface treatment on the exposed first portion of said stress-inducing layer in the presence of said mask material, and removing a second portion of said stress-inducing layer not subjected to said surface treatment.

2. The method of claim 1, wherein forming said stress decoupling region comprises reducing a thickness of said second portion of said stress-inducing layer between said first and second transistors.

3. The method of claim 2, wherein said stress-inducing layer is substantially completely removed in said stress decoupling region.

4. The method of claim 2, wherein reducing a thickness of said second portion of said stress-inducing layer in said stress decoupling region comprises forming an etch mask that covers at least a portion of said first and second transistors and exposes said stress decoupling region.

5. The method of claim 4, wherein said etch mask is formed so as to expose a portion of said stress-inducing layer formed above a third transistor.

6. The method of claim 5, further comprising removing said exposed portion of said stress-inducing layer and forming a second stress-inducing layer above said third transistor.

7. The method of claim 6, further comprising removing said second stress-inducing layer from above said first and second transistors and from said stress decoupling region.

8. The method of claim 7, wherein said stress-inducing layer and said second stress-inducing layer have a different type of internal stress.

9. The method of claim 1, wherein said stress decoupling region laterally encloses said first transistor and said second transistor so as to provide a first island of stress-inducing material formed above said first transistor and a second island of stress-inducing material formed above said second transistor.

10. The method of claim 1, further comprising forming an interlayer dielectric material above said stress-inducing layer, wherein said interlayer dielectric material comprises a copper diffusion hindering material at least in said stress decoupling region.

11. The method of claim 1, wherein performing said surface treatment comprises forming an oxygen-containing surface layer on said exposed first portion of said stress-inducing layer.

12. The method of claim 11, wherein forming said oxygen-containing surface layer comprises exposing said exposed first portion of said stress-inducing layer to a plasma ambient including oxygen.

13. The method of claim 1, wherein forming the mask material comprises:
    forming a layer of said mask material above said first and second transistors; and
    removing a portion of said mask material to expose a surface of said stress-inducing layer disposed directly above said first and second transistors while covering a surface of said stress-inducing layer disposed between said first and second transistors.

14. The method of claim 13, wherein forming said layer of said mask material comprises forming a planarized layer of said mask material having a first thickness directly above said first and second transistors less than a second thickness between said first and second transistors.

15. A method, comprising:
    forming a stress-inducing layer above a first transistor and a second transistor formed in a device level of a semiconductor device; and
    forming a stress decoupling region in said stress-inducing layer between said first and second transistors, said stress decoupling region extending along a transistor width direction of said first and second transistors by forming a mask material on said stress-inducing layer and above said first and second transistors, removing a portion of said mask material disposed directly above said first and second transistors while covering a surface of said stress-inducing layer disposed between said first and second transistors so as to expose a first portion of said stress-inducing layer, performing a surface treatment on the exposed first portion of said stress-inducing layer in the presence of said mask material so as to form an oxygen-containing surface layer on said exposed first portion of said stress-inducing layer, and removing a second portion of said stress-inducing layer not subjected to said surface treatment.

16. The method of claim 15, wherein performing said surface treatment to form said oxygen-containing surface layer comprises exposing said exposed first portion of said stress-inducing layer to a plasma ambient including oxygen.

17. A method, comprising:
forming a stress-inducing layer above a first transistor and a second transistor formed in a device level of a semiconductor device; and
forming a stress decoupling region in said stress-inducing layer between said first and second transistors, said stress decoupling region extending along a transistor width direction of said first and second transistors by forming a mask material on said stress-inducing layer, removing a portion of said mask material so as to expose a first portion of said stress-inducing layer, performing a surface treatment on the exposed first portion of said stress-inducing layer in the presence of said mask material so as to form an oxygen-containing surface layer on said exposed first portion of said stress-inducing layer, and removing substantially all of a second portion of said stress-inducing layer not subjected to said surface treatment.

* * * * *

UNITED STATES PATENT AND TRADEMARK OFFICE
CERTIFICATE OF CORRECTION

| | |
|---|---|
| PATENT NO. | : 8,828,887 B2 |
| APPLICATION NO. | : 13/687877 |
| DATED | : September 9, 2014 |
| INVENTOR(S) | : Frohberg et al. |

Page 1 of 1

It is certified that error appears in the above-identified patent and that said Letters Patent is hereby corrected as shown below:

In the Claims

In claim 3, at column 14, line 9, after "wherein", insert -- said second portion of --.

Signed and Sealed this
Sixth Day of January, 2015

Michelle K. Lee
*Deputy Director of the United States Patent and Trademark Office*